(12) United States Patent
Yamamura et al.

(10) Patent No.: US 11,430,653 B2
(45) Date of Patent: Aug. 30, 2022

(54) METHOD OF MANUFACTURING HIGH ELECTRON MOBILITY TRANSISTOR AND HIGH ELECTRON MOBILITY TRANSISTOR

(71) Applicant: SUMITOMO ELECTRIC INDUSTRIES, LTD., Osaka (JP)

(72) Inventors: Takuji Yamamura, Osaka (JP); Kenya Nishiguchi, Osaka (JP); Kazuhide Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 88 days.

(21) Appl. No.: 17/036,711

(22) Filed: Sep. 29, 2020

(65) Prior Publication Data
US 2021/0104395 A1    Apr. 8, 2021

(30) Foreign Application Priority Data
Oct. 4, 2019    (JP) .............................. JP2019-183876

(51) Int. Cl.
*H01L 21/02*    (2006.01)
*H01L 29/778*    (2006.01)
(Continued)

(52) U.S. Cl.
CPC .......... *H01L 21/022* (2013.01); *C23C 16/345* (2013.01); *C23C 16/40* (2013.01);
(Continued)

(58) Field of Classification Search
CPC ............. H01L 21/0217; H01L 29/6653; H01L 29/66553; H01L 29/6656; H01L 21/28132;
(Continued)

(56) References Cited

U.S. PATENT DOCUMENTS 4,996,081 A * 2/1991 Ellul .................. H01L 21/0217
427/255.18
5,397,748 A * 3/1995 Watanabe ......... H01L 21/02255
257/E21.301
(Continued)

FOREIGN PATENT DOCUMENTS

JP    H07142730 A  *  6/1995  ............. H01L 29/78
JP    2004-214471        7/2004
(Continued)

OTHER PUBLICATIONS

Machine Translation of Foreign Patent Document: JP-H07142730-A (Year: 1995).*

(Continued)

*Primary Examiner* — Scott B Geyer
(74) *Attorney, Agent, or Firm* — Smith, Gambrell & Russell, LLP.

(57) ABSTRACT

A method of manufacturing a high electron mobility transistor in a furnace, the method including steps of: forming a first SiN film on a surface of a semiconductor stack consisting of a nitride semiconductor and including a barrier layer by a low pressure chemical vapor deposition method at a first furnace temperature of 700° C. or more and 900° C. or less; forming an interface oxide layer on the first SiN film by moisture and oxygen in the furnace at a second furnace temperature of 700° C. or more and 900° C. or less and a furnace pressure to 1 Pa or lower; and forming a second SiN film on the interface oxide layer by the low pressure chemical vapor deposition method at a third furnace temperature of 700° C. or more and 900° C. or less.

4 Claims, 9 Drawing Sheets

(51) Int. Cl.
  *H01L 23/31* (2006.01)
  *H01L 23/29* (2006.01)
  *C23C 16/34* (2006.01)
  *C23C 16/40* (2006.01)
  *H01L 21/8234* (2006.01)
  *H01L 29/51* (2006.01)
  *H01L 29/66* (2006.01)

(52) U.S. Cl.
  CPC .... *H01L 21/823468* (2013.01); *H01L 23/291* (2013.01); *H01L 23/3171* (2013.01); *H01L 29/512* (2013.01); *H01L 29/518* (2013.01); *H01L 29/6656* (2013.01); *H01L 29/7786* (2013.01); *H01L 21/0214* (2013.01); *H01L 21/0217* (2013.01); *H01L 21/0228* (2013.01); *H01L 21/02269* (2013.01)

(58) Field of Classification Search
  CPC ..... H01L 21/823468; H01L 21/823864; H01L 29/66689; H01L 29/66719; H01L 29/4983; H01L 29/2003; C01B 21/068; C01B 21/0682; C23C 14/0652; C23C 16/345
  See application file for complete search history.

(56) References Cited

U.S. PATENT DOCUMENTS

| | | | | |
|---|---|---|---|---|
| 5,795,821 | A * | 8/1998 | Bacchetta | H01L 21/02282 257/E21.279 |
| 5,795,833 | A * | 8/1998 | Yu | H01L 21/02211 257/E21.279 |
| 6,177,363 | B1 * | 1/2001 | Roy | H01L 21/022 438/791 |
| 2006/0043415 | A1 | 3/2006 | Okamoto et al. | |
| 2007/0297244 | A1 * | 12/2007 | Wu | H01L 29/7923 365/185.28 |
| 2008/0121876 | A1 | 5/2008 | Otsuka et al. | |
| 2009/0039426 | A1 * | 2/2009 | Cartier | H01L 29/6659 257/E21.415 |
| 2013/0005154 | A1 * | 1/2013 | Lee | H01L 21/02359 438/763 |
| 2014/0252431 | A1 * | 9/2014 | Lee | H01L 29/6656 438/585 |
| 2016/0225886 | A1 | 8/2016 | Saito et al. | |
| 2017/0271518 | A1 * | 9/2017 | Ushikura | H01L 29/78609 |
| 2018/0122718 | A1 * | 5/2018 | Isaka | H01L 29/42316 |
| 2018/0277650 | A1 * | 9/2018 | Matsushita | H01L 29/518 |
| 2019/0244823 | A1 * | 8/2019 | Yoshida | H01L 21/0272 |
| 2020/0044067 | A1 * | 2/2020 | Banerjee | H01L 21/02271 |
| 2020/0105683 | A1 * | 4/2020 | Yen | H01L 21/0217 |
| 2020/0144386 | A1 * | 5/2020 | Kanda | H01L 29/0843 |
| 2020/0219987 | A1 * | 7/2020 | Lee | H01L 21/0217 |
| 2021/0328029 | A1 * | 10/2021 | Liao | H01L 21/0217 |

FOREIGN PATENT DOCUMENTS

| | | |
|---|---|---|
| JP | 2007-027284 | 2/2007 |
| JP | 2008-034438 | 2/2008 |
| JP | 2016-143843 | 8/2016 |

OTHER PUBLICATIONS

Liu, Shih-Chien et al., "Effective Passivation With High-Density Positive Fixed Charges for GaN MIS-HEMTs", Journal of the Electron Devices Society, IEEE, vol. 5, No. 3, p. 170-174, May 2017.
Zhang, K., et al., "Observation of threshold voltage instabilities in AlGaN/GaN MIS HEMTs", Semiconductor Science and Technology, vol. 29, p. 1-6, (2014)

* cited by examiner

Fig.7

METHOD OF MANUFACTURING HIGH ELECTRON MOBILITY TRANSISTOR AND HIGH ELECTRON MOBILITY TRANSISTOR

CROSS-REFERENCE TO RELATED APPLICATIONS

The disclosure of Japanese Patent Application No. 2019-183876 filed on Oct. 4, 2019 including the specification, drawings and abstract is incorporated herein by reference in its entirety.

BACKGROUND

The present disclosure relates to a method of manufacturing a high electron mobility transistor and a high electron mobility transistor.

JP2016-143843A discloses a semiconductor device. The semiconductor device includes a first GaN-based semiconductor layer, a second GaN-based semiconductor layer, a source electrode, drain electrode, gate electrode, and a passivation film. The second GaN-based semiconductor layer provided on the first GaN-based semiconductor layer has a larger band gap than the first GaN-based semiconductor layer. The source electrode and the drain electrode are electrically connected to the second GaN-based semiconductor layer. The gate electrode is provided between the source and drain electrodes. The passivation film is provided on the second GaN-based semiconductor layer between the source electrode and the gate electrode, and between the drain electrode and the gate electrode. The passivation film includes a first insulating film containing nitrogen and having a thickness of 0.2 nm or more and 2 nm or less, and a second insulating film which is provided over the first insulating film and contains oxygen.

JP2008-034438A discloses a semiconductor device. The semiconductor device includes a main semiconductor region having a crystal structure, a plurality of electrodes connected to the main semiconductor region, and a surface stabilized semiconductor layer. The surface stabilized semiconductor layer consists of a different material from the main semiconductor region and, and is disposed on at least a portion of the surface between the plurality of electrodes of the main semiconductor region, and has a function of canceling an electric charge of the surface of the main semiconductor region. The surface stabilized semiconductor layer is a p-type metal oxide semiconductor layer or an n-type metal oxide semiconductor layer.

JP2007-027284A discloses a field effect transistor. This field-effect transistor comprises a semiconductor substrate, a source electrode, a drain electrode, a gate electrode, and an organic semiconductor film. The semiconductor substrate includes a first semiconductor layer and a second semiconductor layer disposed adjacent the first semiconductor layer to produce a two-dimensional electron gas. The source electrode and the drain electrode are formed on one main surface of the semiconductor substrate. The gate electrode is disposed between the source electrode and the drain electrode on one main surface of the semiconductor substrate. Organic semiconductor film has a p-type conductivity type, is disposed on at least a portion between the source electrode and the drain electrode of one main surface of the semiconductor substrate.

JP2004-214471A discloses a technique related to a field effect transistor. The field effect transistor includes a group III nitride semiconductor layer structure including a heterojunction, a source electrode and a drain electrode formed spaced apart on the semiconductor layer structure, and a gate electrode disposed between the source electrode and the drain electrode. In the region between the gate electrode and the drain electrode, the electric field control electrode is formed through an insulating film on top of the group III nitride semiconductor layer structure. The insulating film includes a first insulating film containing silicon and nitrogen as constituent elements, and a second insulating film having a lower relative dielectric constant than the first insulating film.

Literature 1 (Shih-Chien Liu et al., "Effective Passivation With High-Density Positive Fixed Charges for GaN MIS-HEMTs", Journal of the Electron Devices Society, IEEE, Volume 5, No. 3, May 2017) discloses a technique related to a high electron mobility transistor (High Electron Mobility Transistor: HEMT) mainly made of GaN-based semiconductors. In this Literature, it is described that a surface potential is controlled by providing a SiON film on a surface of a semiconductor layer.

SUMMARY

Method of manufacturing a HEMT in a furnace according to an embodiment, comprising steps of: forming a first SiN film on a surface of a semiconductor stack consisting of a nitride semiconductor and including a barrier layer by a low pressure chemical vapor deposition method at a first furnace temperature of 700° C. or more and 900° C. or less; forming an interface oxide layer on the first SiN film by moisture and oxygen in the furnace at a second furnace temperature of 700° C. or more and 900° C. or less and a furnace pressure of 1 Pa or lower, and forming a second SiN film on the interface oxide layer by the low pressure chemical vapor deposition method at a third furnace temperature of 700° C. or more and 900° C. or less.

A HEMT according to an embodiment includes a semiconductor stack and a surface protection film. The semiconductor stack consists of a nitride semiconductor and includes a barrier layer. The surface protection film has a first SiN film provided on a surface of the semiconductor stack and a second SiN film provided on the first SiN film. The surface protection film includes an interface oxide layer between the first SiN film and the second SiN film. The interface oxide layer includes oxygen atoms exceeding $5\times10^{21}$ atoms/cm$^3$ and chlorine atoms exceeding $1\times10^{20}$ atoms/cm$^3$ and has a thickness of 1 nm or less.

DETAILED DESCRIPTION

In HEMT of a nitride-based semiconductor as a main constituent material, the drain current is reduced when a high voltage is applied (on-resistance is increased), so-called the current collapse has become a problem. That is, when electrons in the two-dimensional electron gas layer are accelerated by a high voltage, electrons are trapped at the interface state in the barrier layer, the semiconductor surface potential is increased. This reduces electrons in the two-dimensional electron gas layer.

A Si compound film is deposited as a protection film on the surface of the nitride semiconductor layer. If a fixed positive charge having a density equal to or greater than the interface state density is present in the Si compound film, the increase in the semiconductor surface potential is suppressed. For example, Literature 2 (K. Zhang et al., "Observation of threshold voltage instabilities in AlGaN/GaN MIS HEMTs", Semiconductor Science and Technology, Vol. 29, 2014) describes that the interface state density of SiN/GaN is about from $1.0 \times 10^{12}$ to $1.0 \times 10^{13}$ $cm^{-2}$. Literature 1 describes that a SiON film having fixed positive charges density of $2.7 \times 10^{13}$ $cm^{-2}$ in the film is used as a surface protection film, whereby an increase in the surface potential of semiconductors can be suppressed and current collapse can be reduced.

When a Si oxide film such as a SiON film or a $SiO_2$ film is used as a surface protection film of the nitride semiconductor layer, the following problems arise. Usually, the surface protection film is provided with an opening for contacting the gate electrode and the nitride semiconductor layer (gate opening). When a Si compound film is used as the surface protection film, a fluorine-based gas having a high etching selectivity to a nitride semiconductor is used as an etching gas when the gate opening is formed by dry etching. When the surface protection film is a Si oxide film such as a SiON film or a $SiO_2$ film, the etching rate of the surface protection film is lower than the etching rate of the SiN film. Therefore, an increase in the etching time leads to an increase in the cost. Furthermore, since the overetching time also increases, the damage to the semiconductor surface is increased.

As described in JP2008-034438A and JP2007-027284A, it is also conceivable to add a p-type semiconductor layer or the like in order to reduce the semiconductor surface potential. Alternatively, as described in JP2004-214471A, it is also conceivable to add an electric field control electrode between the gate electrode and the drain electrode. These configurations increase the material cost for forming the semiconductor layer and the electrode.

It is therefore an object of the present disclosure to provide a method for manufacturing a HEMT, and a HEMT capable of suppressing a decrease in an etching rate of a surface protection film and reducing current collapse without increasing materials costs.

First, embodiments of the present disclosure are listed and described. Method of manufacturing a HEMT according to an embodiment, comprising steps of: forming a first SiN film on a surface of a semiconductor stack consisting of a nitride semiconductor and including a barrier layer by a low pressure chemical vapor deposition method at a first furnace temperature of 700° C. or higher and 900° C. or lower, forming an interface oxide layer on the first SiN film by moisture and oxygen in the furnace at a second furnace temperature of 700° C. or higher and 900° C. or lower and a furnace pressure of 1 Pa or lower, and forming a second SiN film on the interface oxide layer by the low pressure chemical vapor deposition method at a third furnace temperature of 700° C. or higher and 900° C. or lower.

This manufacturing method includes a step of forming the interface oxide layer after forming the first SiN film on the surface of the semiconductor stack by the low pressure chemical vapor deposition method and before forming the second SiN film. In this process, the furnace pressure is set at 1 Pa or less, and while keeping the furnace temperature within the deposition temperature range of SiN, to form the interface oxide layer on the first SiN film by moisture and oxygen in the furnace. The interface oxide layer formed at this time is an extremely thin layer having a thickness of, for example, 1 nm or less. Thus, an extremely thin interface oxide layer is provided between the first SiN film and the second SiN film. This interface oxide layer has a fixed positive charge to form an interface state. As a result, it is possible to reduce the current collapse by suppressing the semiconductor surface potential. Further, since the interface oxide layer is very thin, the disadvantage that the etching rate is lower than the SiN film is hardly a problem. Therefore, as compared with the case where the surface protection film is a silicon oxide film such as a SiON film or a $SiO_2$ film, it is possible to suppress a decrease in the etching rate of the surface protection film. In addition, since the interface oxide layer can be formed only by suspending the process of forming the SiN film, the material cost does not increase.

In the above manufacturing method, the step of forming the interface oxide layer may be continued for at least 30 seconds. In this case, an interface oxide layer can be easily formed.

In the above manufacturing method, in the steps of forming the first SiN and the interface oxide layer, a ratio of a flow rate of dichlorosilane gas as a silicon raw material to a flow rate of ammonia gas as a nitrogen raw material may be set to 1:1. In this case, a high quality SiN film can be formed.

In the above manufacturing method, the second temperature and the third temperature may be equal to the first temperature. In this case, the time required for the temperature change can be omitted, and the second SiN film can be efficiently formed.

A HEMT according to an embodiment includes a semiconductor stack and a surface protection film. The semiconductor stack consists of a nitride semiconductor and includes a barrier layer. The surface protection film has a first SiN film provided on the surface of the semiconductor stack and a second SiN film provided on the first SiN film. The surface protection film further comprises an interface oxide layer between the first SiN film and the second SiN film. The interface oxide layer includes oxygen atoms exceeding $5 \times 10^{21}$ $atoms/cm^3$ and chlorine atoms exceeding $1 \times 10^{20}$ $atoms/cm^3$ and has a thickness of 1 nm or less.

This HEMT has an extremely thin interface oxide layer with a thickness of less than 1 nm between the first SiN film and the second SiN film. This interface oxide layer has a fixed positive charge to form an interface state. As a result, it is possible to reduce the current collapse by suppressing the semiconductor surface potential. Further, since the interface oxide layer is very thin, the disadvantage that the etching rate is slower than the SiN film is hardly a problem. Therefore, as compared with the case where the surface protection film is a silicon oxide film such as a SiON film or a $SiO_2$ film, it is possible to suppress a decrease in the etching rate of the surface protection film. In addition, since the interface oxide layer can be formed only by suspending the process of forming the SiN film, the material cost does not increase.

In the above HEMT, the first SiN film and the second SiN film may contain chlorine atoms exceeding $1 \times 10^{20}$ atoms/$cm^3$. When the first SiN film and the second SiN film are formed by the LP CVD method, the first SiN film and the second SiN film contain such a high concentration of chlorine atoms.

Specific examples of a HEMT and the manufacturing methods of the HEMT of the present disclosure are described below with reference to the accompanying drawings. It should be noted that the present disclosure is not limited to these examples, but is indicated by the claims, and it is intended to include all modifications within the meaning and range equivalent to the claims. In the following description, in the description of the drawings, the same elements are denoted by the same reference numerals, and a repetitive description is omitted.

Figure 1:
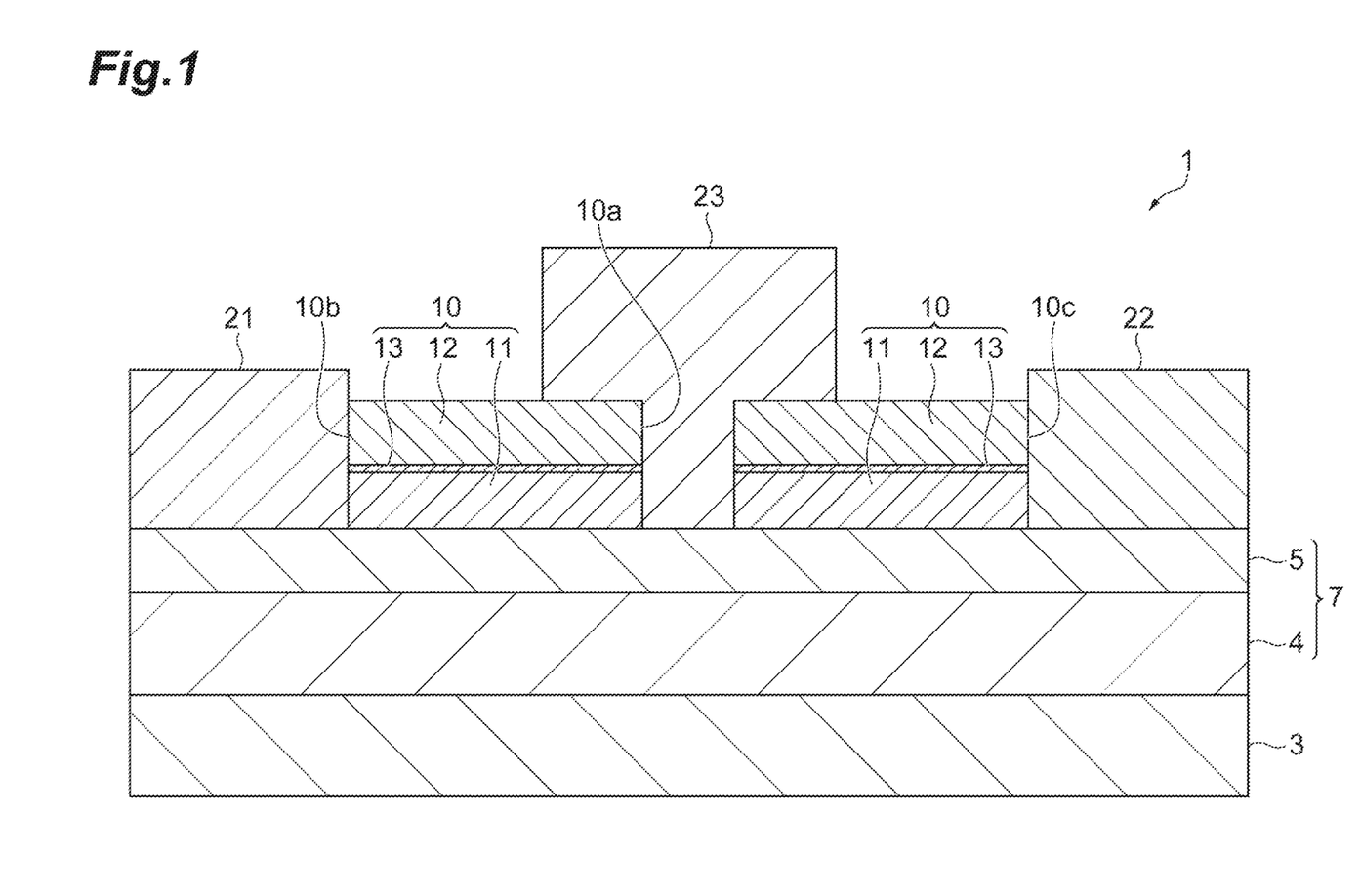
FIG. 1 is a cross-sectional view showing an example of a transistor manufactured by a manufacturing method according to an embodiment.

FIG. 1 is a cross-sectional view showing an example of a transistor 1 manufactured by a manufacturing method according to an embodiment. As shown in FIG. 1, the transistor 1 includes a substrate 3, a semiconductor stack 7, a surface protection film 10, a source electrode 21, a drain electrode 22, and a gate electrode 23. Semiconductor stack 7 consists of a nitride semiconductor. The semiconductor stack 7, in order from the substrate 3, includes a channel layer 4 and the barrier layer 5. The transistor 1 is a HEMT, the two-dimensional electron-gas (2 Dimensional Electron Gas: 2DEG) is generated at the interface between the channel layer 4 and the barrier layer 5, the channel region is formed in the channel layer 4.

The substrate 3 is a substrate for crystal growth. The substrate 3 may be, for example, a SiC substrate, a GaN substrate, or a Sapphire ($Al_2O_3$) substrate. In this embodiment, the substrate 3 is a SiC substrate. The channel layer 4 is a layer epitaxially grown on the substrate 3, and has a channel region where the two-dimensional electron gas described above generates and the drain current flows. The channel layer 4 is comprised a nitride semiconductor. For example, the channel layer 4 is a GaN layer. The thickness of the channel layer 4 is, for example, 400 nm or more and 2000 nm or less.

The barrier layer 5 is a layer epitaxially grown on the channel layer 4. The barrier layer 5 is comprised nitride semiconductors having a larger electron affinity than the channel layer 4. For example, the barrier layer 5 is an AlGaN layer, an InAlN layer, or an InAlGaN layer. The barrier layer 5 may contain an impurity. In the present embodiment, the barrier layer 5 is an n-type AlGaN layer. The thickness of the barrier layer 5 is, for example, 5 nm or more and 30 nm or less.

A buffer layer (not shown) may be provided between the substrate 3 and the channel layer 4. The buffer layer is a buffer layer for epitaxially growing the channel layer 4 and the barrier layer 5 on the substrate 3 which is a dissimilar substrate. The buffer layer is comprised a nitride semiconductor. For example, the buffer layer is an AlN layer. The thickness of the buffer layer is, for example, 10 nm or more and 100 nm or less. A cap layer (not shown) may be provided on the barrier layer 5. The cap layer is a layer epitaxially grown on the barrier layer 5. The cap layer is comprised a nitride semiconductor. For example, the cap layer is a GaN layer. The cap layer may also include impurities. In the present embodiment, the cap layer is an n-type GaN layer. The lower limit of the thickness of the cap layer is, for example, 1.5 nm. The upper limit of the thickness of the cap layer is, for example, 5.0 nm.

The surface protection film 10 is an insulating film provided on the surface of the semiconductor stack 7, in this embodiment, on the barrier layer 5. The surface protection film 10 include an SiN film 11 (the first SiN film), an SiN film 12 (the second SiN film), and an interface oxide layer 13. SiN film 11 is a film made of silicon nitride (SiN) provided on the surface of the semiconductor stack 7, and is in contact with the surface of the semiconductor stack 7. As described later, the SiN film 11 is formed by a low pressure chemical vapor deposition (LPCVD) method. Since the deposition temperature in the LPCVD method is high temperature, for example, as compared with the case of being formed by a plasma CVD method, the film quality of the SiN film 11 is dense. The lower limit value of the thickness of the SiN film 11 is, for example, 10 nm, and the upper limit value is, for example, 100 nm. The SiN film 11 formed by the LPCVD method contains chlorine atoms exceeding $1 \times 10^{20}$ atoms/$cm^3$.

The SiN film 12 is a film made of SiN provided on the SiN film 11 similar to the SiN film 11, the SiN film 12 is also formed by the LPCVD method. Therefore, the film quality of the SiN film 12 is also dense as in the case of the SiN film 11. The lower limit value of the thickness of the SiN film 12 is, for example, 10 nm, and the upper limit value is, for example, 100 nm. In one example, the SiN film 12 has a film of the same thickness as that of the SiN film 11. The SiN film 12 formed by the LPCVD method contains chlorine atoms exceeding $1 \times 10^{20}$ atoms/$cm^3$.

The interface oxide layer 13 is an extremely thin layer located between the SiN film 11 and the SiN film 12. The interface oxide layer 13 contains oxygen atoms in excess of $5 \times 10^{21}$ atoms/$cm^3$ and chlorine atoms in excess of $1 \times 10^{20}$ atoms/$cm^3$. The interface oxide layer 13 is a layer having a thickness of only a few atoms, for example, a thickness of 1 nm or less. As described later, the interface oxide layer 13 is formed by oxidizing the surface of the SiN film 11 with moisture and oxygen contained in the degas released into the furnace by vacuum evacuation between completing film formation of the SiN film 11 and starting film formation of the SiN film 12. That is, the interface oxide layer 13 contains SiON.

In this embodiment, a method of measuring the density of oxygen atoms and chlorine atoms is a secondary ion mass spectrometry method.

The surface protection film 10 has a gate opening 10a, a source opening 10b, and a drain opening 10c. The gate opening 10a is located between the source opening 10b and the drain opening 10c. In the gate opening 10a, the source opening 10b, and the drain opening 10c, the surface of the semiconductor stack 7 is exposed.

The source electrode 21 closes the source opening 10b, and is also provided on the semiconductor stack 7 in contact with the barrier layer 5 through the source opening 10b. The drain electrode 22 closes the drain opening 10c, and is also provided on the semiconductor stack 7 in contact with the barrier layer 5 through the drain opening 10c. The source electrode 21 and the drain electrode 22 are ohmic electrodes, for example, those are formed by alloying the stacking structure of the titanium (Ti) layer and the aluminum (Al) layer. The source electrode 21 and the drain electrode 22 may be alloyed after further stacking another Ti layer on the Al layer.

Gate electrode 23 is provided in a region on the semiconductor stack 7 between the source electrode 21 and the drain electrode 22, in contact with the surface of the SiN film 12, and also in contact with the cap layer (or the barrier layer 5) of the semiconductor stack 7 through the gate opening 10a. Specifically, the gate electrode 23 embeds the gate opening 10a, and is in contact with the semiconductor stack 7 in the gate opening 10a and the side wall of the gate opening 10a. The gate electrode 23 includes a material in Schottky contact with the semiconductor stack 7, for example, a stacking structure of a nickel (Ni) layer and a gold (Au) layer. In this case, the Ni layer is in Schottky contact with the semiconductor stack 7. As a material which can make Schottky contact with the semiconductor stack 7, Pt (platinum) or the like is exemplified in addition to Ni. The thickness of the Ni layer is 200 nm, for example, and the thickness of the Au layer is 700 nm, for example.

Here, a method of manufacturing the transistor 1 according to the present embodiment is described with reference to FIGS. 2A, 2B, 3A, 3B, 4A, and 4B. FIGS. 2A, 2B, 3A, 3B, 4A, and 4B are diagrams for explaining a method of manufacturing the transistor 1 according to the present embodiment.

Figure 2A:
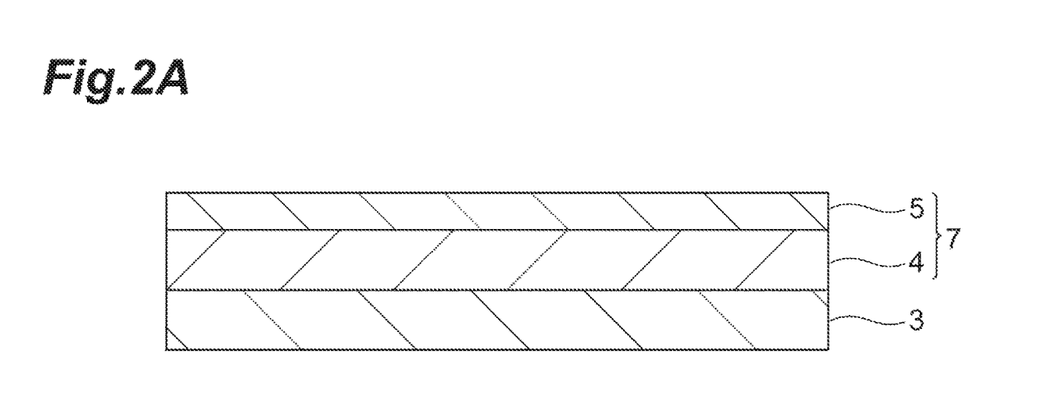
FIGS. 2A and 2B are diagrams illustrating a method of manufacturing the transistor according to the embodiment.

First, as shown in FIG. 2A, a semiconductor stack 7 including the channel layer 4 and the barrier layer 5 is formed on the substrate 3. For example, a GaN layer functioning as the channel layer 4 and a AlGaN layer functioning as the barrier layer 5 are sequentially grown on the SiC substrate by using a metal organic chemical vapor deposition (MOCVD). Before the channel layer 4 is grown, an AlN layer functioning as a buffer layer may be grown. After the barrier layer 5 is grown, a GaN layer functioning as a cap layer may be further grown.

Figure 2B:
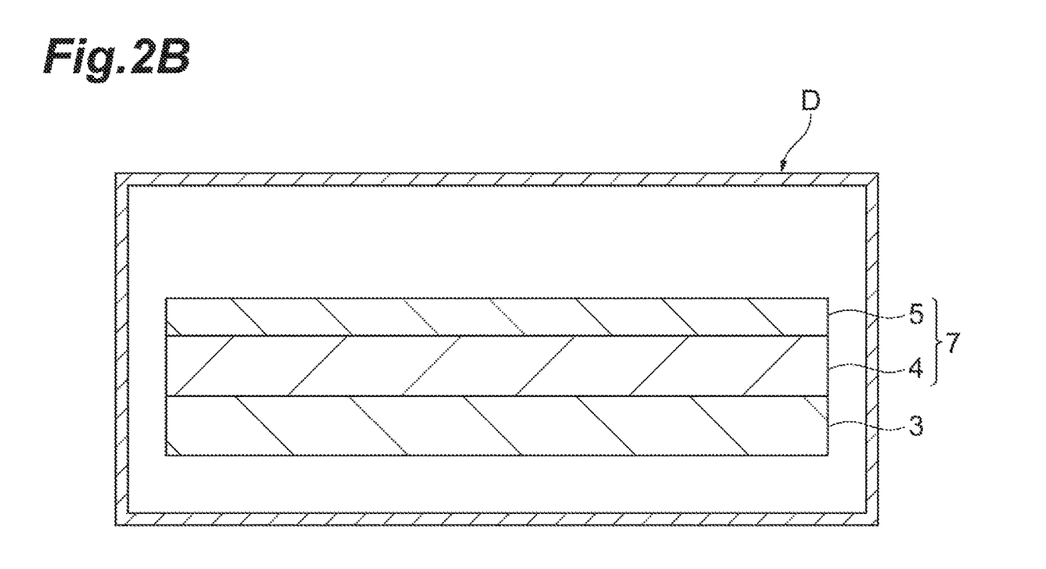

Next, the temperature in the furnace for forming the SiN films 11 and 12 is raised to a predetermined temperature. This predetermined temperature is lower than the temperature at which the SiN films 11 and 12 are formed, and is, for example, 500° C. or less. By setting the temperature to 500° C. or less, it is possible to prevent the vapor pressure from falling below the equilibrium vapor pressure of GaN at the time of decompression and to suppress the decomposition of GaN. Then, the substrate 3 on which the semiconductor stack 7 is formed is set in the conveying device, and is transported into the furnace D in an atmosphere as shown in FIG. 2B.

Subsequently, a leak of the furnace D is checked. Specifically, the temperature in the furnace D is set to a temperature lower than the furnace temperature at forming the SiN film 11. In this state, the furnace pressure in the furnace D is evacuated so as to be 1 Pa or less. Then, the exhaust is stopped and the airtight state in the furnace D is maintained. In this state, a leak is checked for a predetermined period of time. When the airtight state in the furnace D is maintained, the pressure in the furnace is slightly increased by degas generated in the furnace D. In this leak check, the pressure rise in the furnace D is confirmed, which is corresponding to the degas flow rate, for example, 0.1 sccm (Standard Cubic Centimeter per Minute) or more. The degree of pressure increase in the furnace varies with the volume of the furnace D. Degas flow rate can be estimated based on, for example, the pressure increase per hour and the volume of the furnace D. The leak check time is, for example, 30 seconds or more and 300 seconds or less, and in one example, 90 seconds. After the leak check, the atmosphere in the furnace D is again evacuated to a pressure of 1 Pa or less, and thereafter, nitrogen gas is supplied into the furnace D to set the pressure in the furnace to, for example, 100 k Pa.

Figure 3A:
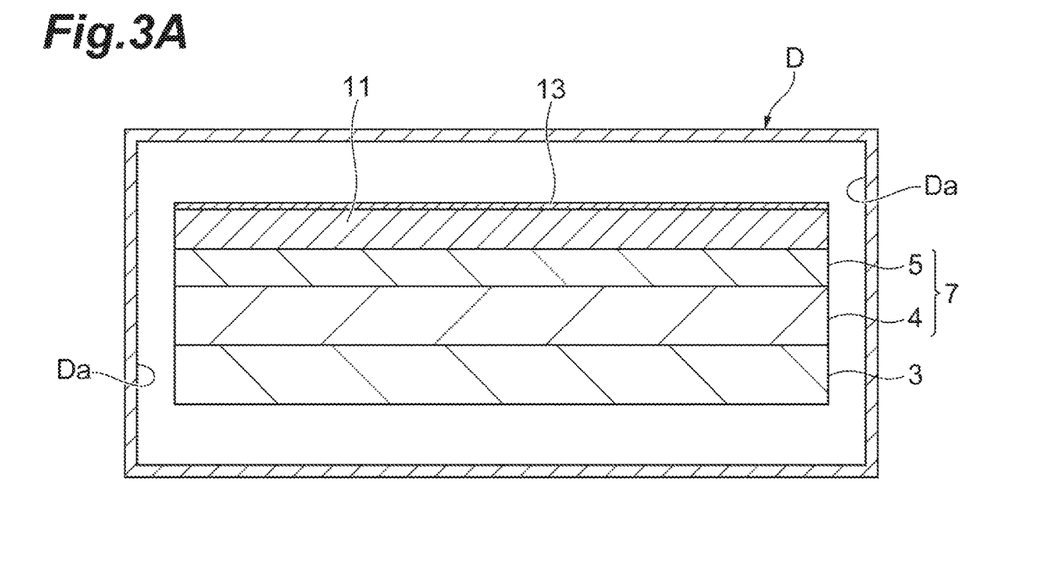
FIGS. 3A and 3B are diagrams illustrating a method of manufacturing the transistor according to the embodiment.

Subsequently, as shown in FIG. 3A, a SiN film 11 covering the surface of the semiconductor stack 7 is formed in the furnace D. In this process, the SiN film 11 is deposited on the semiconductor stack 7 by the LPCVD method using dichlorosilane gas as a silicon raw material and ammonia gas as a nitrogen raw material. Specifically, first, the temperature in the furnace D, for example, to set the first temperature of 700° C. or higher 900° C. or less. This temperature is much higher than the film forming temperature in the plasma CVD method and is equal to or lower than the growth temperature of the semiconductor stack 7. In one example, the temperature is raised to a first temperature over a period of 10 minutes or more. In one example, the first temperature is 800° C. After the furnace temperature is stabilized, the furnace pressure in the furnace D is evacuated so as to be 1 Pa or less. Thereafter, ammonia is supplied into the furnace D to set the pressure in the furnace to a predetermined pressure. The predetermined pressure is, for example, 5 Pa or more and 50 Pa or less, and 20 Pa in one embodiment. Thereafter, a supply of dichlorosilane gas is started to form a SiN film 11. The ratio of the flow rate of the dichlorosilane gas to the flow rate of the ammonia gas is set to, for example, 1:1. When the thickness of the SiN film 11 reaches a target value (e.g., 10 nm), the supply of dichlorosilane and ammonia is stopped, and the film formation of the SiN film 11 is stopped. The time required for the film formation of the SiN film 11 is, for example, several minutes.

Subsequently, the atmosphere in the furnace D is evacuated to a pressure of 1 Pa or less. Further, the temperature in the furnace D is set to the second temperature of 700° C. or higher and 900° C. or less. In this state, the surface of the SiN film 11 is exposed to the atmosphere in the furnace D for at least 30 seconds. At this time, moisture and oxygen remaining on the furnace wall Da and the like in the furnace D are released into the furnace as a degas to oxidize the surface of the SiN film 11. In addition, moisture and oxygen released as a degas during the leak check described above also oxidize the surface of the SiN film 11. In this manner, the interface oxide layer 13 is formed on the SiN film 11 by moisture and oxygen in the furnace D. The interface oxide layer 13 formed at this time is an extremely thin layer having a thickness of, for example, 1 nm or less. The furnace temperature (the second temperature) at the time of exposing the surface of the SiN film 11 to the atmosphere in the furnace D may be equal to or different from the furnace temperature (the first temperature) at the time of forming the SiN film 11.

The constituent materials of the surfaces of the furnace walls Da in the furnace D may include inorganic oxides such as $SiO_2$. In this case, when vacuum evacuation is performed in the above process, moisture and oxygen are easily released as degas from the furnace wall Da in the surface. Therefore, the interface oxide layer 13 having a sufficient thickness can be easily formed.

Figure 3B:
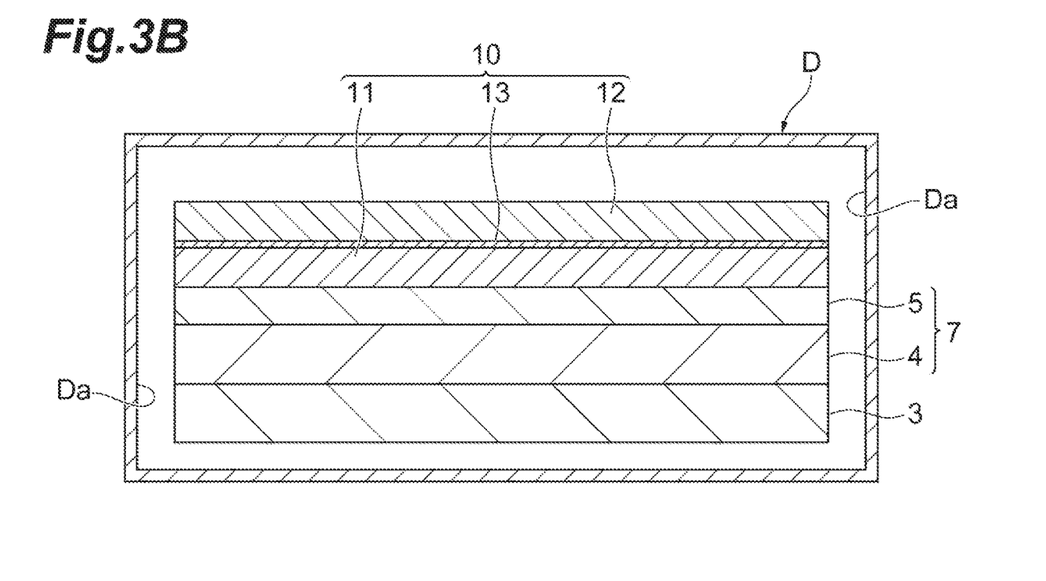

Next, as shown in FIG. 3B, the SiN film 12 is formed on the SiN film 11 (precisely on the interface oxide layer 13) in the furnace D. In this process, as in the case of the SiN film 11, the SiN film 12 is deposited on the SiN film 11 by the LPCVD method using dichlorosilane gas and ammonia gas as raw materials. Specifically, first, the temperature in the furnace D, for example, is set to a third temperature of 700° C. or higher and 900° C. or less. This temperature is much higher than the film formation temperature in the plasma CVD method and is equal to or lower than the growth temperature of the semiconductor stack 7. In one example, the temperature is raised to a third temperature over a period of 10 minutes or more. In one example, the third temperature is 800° C. The furnace temperature (the third temperature) at the time of forming the SiN film 12 may be equal to one or both of the furnace temperature (the first temperature) at the time of forming the SiN film 11 and the furnace temperature (the second temperature) at the time of exposing the surface of the SiN film 11 in the furnace D, or may be different from each other. After the furnace temperature is stabilized, the furnace pressure in the furnace D is evacuated so as to be 1 Pa or less. Thereafter, ammonia is supplied into the furnace D to set the pressure in the furnace to a predetermined pressure. The predetermined pressure is, for example, 5 Pa or more and 50 Pa or less, and 20 Pa in one embodiment. Thereafter, a supply of dichlorosilane gas is started to form a SiN film 12. The ratio of the flow rate of the dichlorosilane gas to the flow rate of the ammonia gas is set to, for example, 1:1. When the thickness of the SiN film 12 reaches a target value (e.g., 10 nm), the supply of dichlorosilane and ammonia is stopped, and the film formation of the SiN film 12 is stopped. The time required for film formation of the SiN film 12 is, for example, several minutes. The film forming time of the SiN film 12 may be equal to, for example, the film forming time of the SiN film 11. In this case, the film thickness of the SiN film 11 and the film thickness of the SiN film 12 become equal to each other.

Subsequently, the temperature in the furnace D is lowered to a predetermined temperature (e.g., 500° C.). Then, in order to expel the chlorine gas in the furnace D generated at the time of film formation, a cycle purge with nitrogen is performed. Once the chlorine gas has been diluted to a dilution limit (e.g., 2 ppm), the substrate 3 is taken out of the furnace D. The concentration of chlorine gas may be measured, for example, by a gas detector. By the above step, the surface protection film 10 including the SiN film 11 and the SiN film 12 is formed.

Figure 4A:
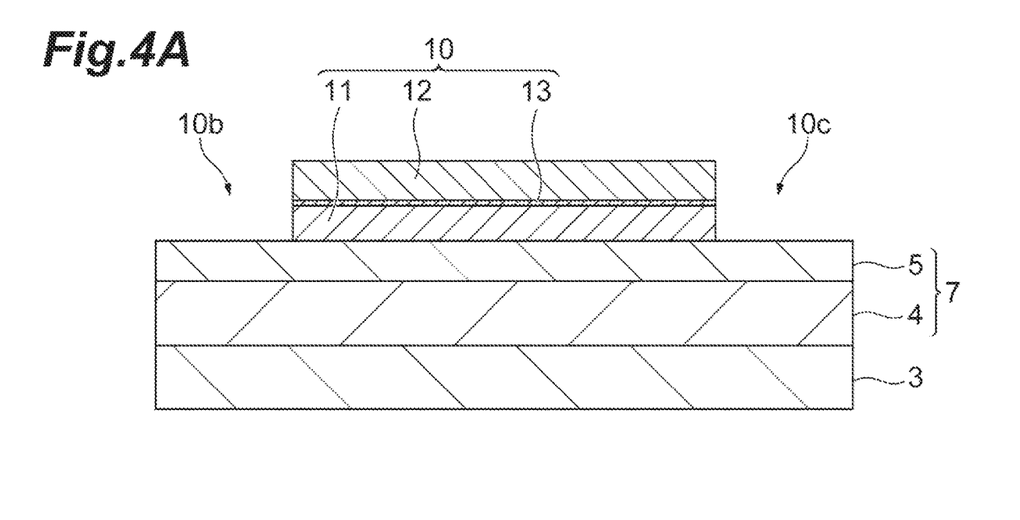
FIGS. 4A and 4B are diagrams illustrating a method of manufacturing the transistor according to the embodiment.
Figure 4B:
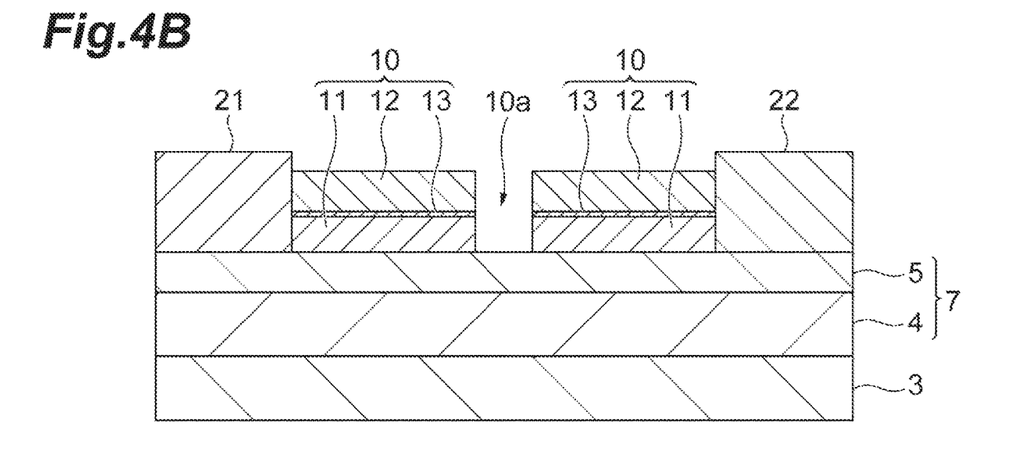

Subsequently, as shown in FIG. 4A, a part of the surface protection film 10 is selectively etched to form a source opening 10b and a drain opening 10c. For example, the source opening 10b and the drain opening 10c are formed in the surface protection film 10 by a selective dry etching through a resist mask. Thereafter, as shown in FIG. 4B, a source electrode 21 is formed in the source opening 10b, and a drain electrode 22 is formed in the drain opening 10c. In this process, the source electrode 21 and the drain electrode 22 are formed by, for example, vacuum metal deposition and lift-off method. The lift-off method is a method of removing unneeded parts of the metal. Thereafter, alloying these electrodes by heat treatment to make ohmic electrodes.

Subsequently, dry etching is selectively performed on the surface protection film 10, whereby the gate opening 10a is formed in the surface protection film 10 to expose the semiconductor stack 7. The dry etching is, for example, reactive ion etching (RIE). As the etching gas, for example, a fluorine-based gas is used. For example, one or more of the group consisting of $SF_6$, $CF_4$, $CHF_3$, $C_3F$, and $C_2F_6$ are selected as the Fluorine-based gases. The RIE equipment may be of an inductively coupled plasma (ICP) type. When fluorine-based gases ($SF_6$) are used, the reaction pressure is set a furnace pressure within a range of 2 to 3 Pa (2 Pa in one embodiment), the RF power (ICP power) is set to a range of 50 to 300 W (100 W in one embodiment), and the bias power is set to a range of 5 to 50 W (10 W in one embodiment), respectively.

Subsequently, in the gate opening 10a and on the surface of the SiN film 12 at the periphery of the gate opening 10a, a gate electrode 23 is formed by the lift-off method. In this process, a stacking film of nickel (Ni) and gold (Au) as the gate metal is deposited on the semiconductor stack 7 and the SiN film 12 by, for example, a resistance heating type vacuum evaporation method. Through the above steps, the transistor 1 of the present embodiment shown in FIG. 1 is manufactured.

The effect obtained by the transistor 1 and the method of manufacturing the transistor 1 according to the present embodiment described above is described. The manufacturing method of the present embodiment includes a step of forming the interface oxide layer 13 (FIG. 3A) after forming the SiN film 11 on the surface of the semiconductor stack 7 by the LPCVD method and before forming the SiN film 12. In this process, by exposing the surface of the SiN film 11 to the atmosphere in the furnace D under the above-described conditions, moisture and oxygen remaining on the furnace wall Da and the like in the furnace D are released into the furnace as a degas, and the surface of the SiN film 11 is oxidized to form an extremely thin interface oxide layer 13. In this manner, an extremely thin interface oxide layer 13 is provided between the SiN film 11 and the SiN film 12 by moisture and oxygen in the furnace D. The interface oxide layer 13 has a fixed positive charge to form an interface state. As a result, it is possible to reduce the current collapse by suppressing the semiconductor surface potential.

Further, since the interface oxide layer 13 is very thin, the disadvantage that the etching rate is slower than the SiN film in dry etching using a fluorine-based gas is hardly a problem. For example, the selectivity ratio between the speed of etching a SiN film and the speed of etching a $SiO_2$ film in dry-etching with $SF_6$ is about 1:4. If the total thickness of the SiN films 11 and 12 is 20 nm and the thickness of the interface oxide layer 13 is 0.5 nm, the increase in etching time due to the presence of the interface oxide layer 13 is about 10 percents. In dry etching, to prevent etching residue, it is common to ensure an overetching time of several tens percents. The increase in etching time due to the presence of the interface oxide layer 13 is a range that can be within a general overetching time. As described above, according to the present embodiment, as compared with the case where the surface protection film is a silicon oxide film such as a SiON film or a $SiO_2$ film, it is possible to suppress a decrease in the etching rate of the surface protection film, and it is possible to eliminate a need for a particular additional process when the gate opening 10a is formed.

Further, the interface oxide layer 13 of the present embodiment can be formed only by suspending the film forming process of the SiN film. Therefore, there is no concern that the material cost increases.

Figure 5:
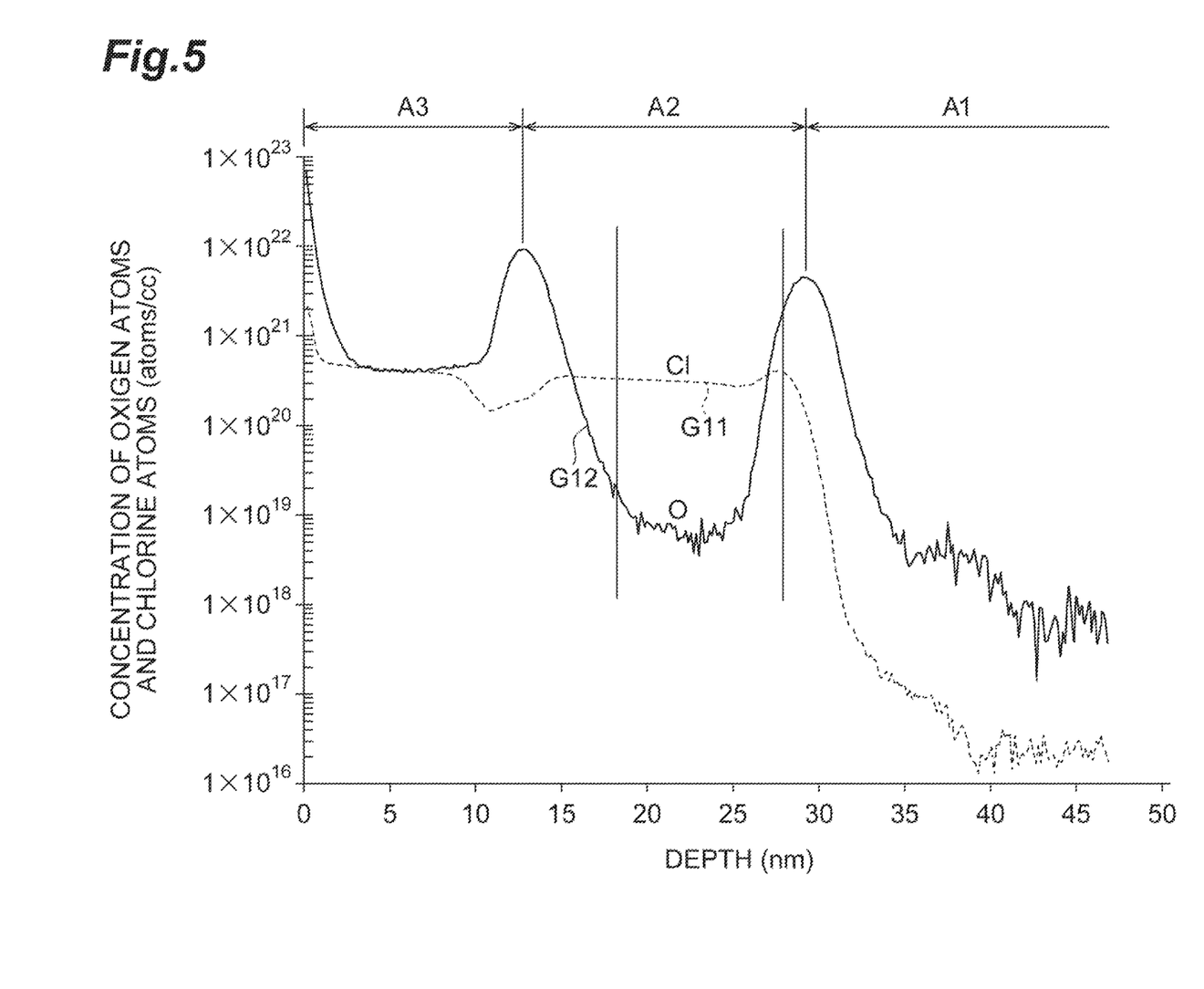
FIG. 5 is a graph showing the analytical results by SIMS in the vicinity of the surfaces of the transistors produced by the manufacturing method of the embodiment.

Here, FIG. 5 is a graph showing an analysis result by secondary ion mass spectrometry (SIMS) in the vicinity of the surface of the transistor 1 produced by the manufacturing method of the present embodiment. In the figures, the horizontal axis represents the depth position (in nm), and the vertical axis on the left represents the respective concentration (in atoms/cc) of oxygen atoms (O) and chlorine atoms (Cl). The graph G11 shows the Cl concentration, and the graph G12 shows the O concentration. In the figure, a range A1 corresponds to the semiconductor stack 7, a range A2 corresponds to the SiN film 11, and a range A3 corresponds to the SiN film 12.

Referring to FIG. 5, at the interface between the SiN film 11 and the SiN film 12, 0 concentration is significantly increased, it can be seen that forming a peak. Peak-concentration of 0 is about $1\times10^{22}$ atoms/cm$^3$. This means that an interface oxide layer 13 is formed between the SiN film 11 and the SiN film 12. Further, since the flat portion is not present at the top of the peak, the thickness of the interface oxide layer 13 is presumed to be 1 nm or less.

Figure 6:
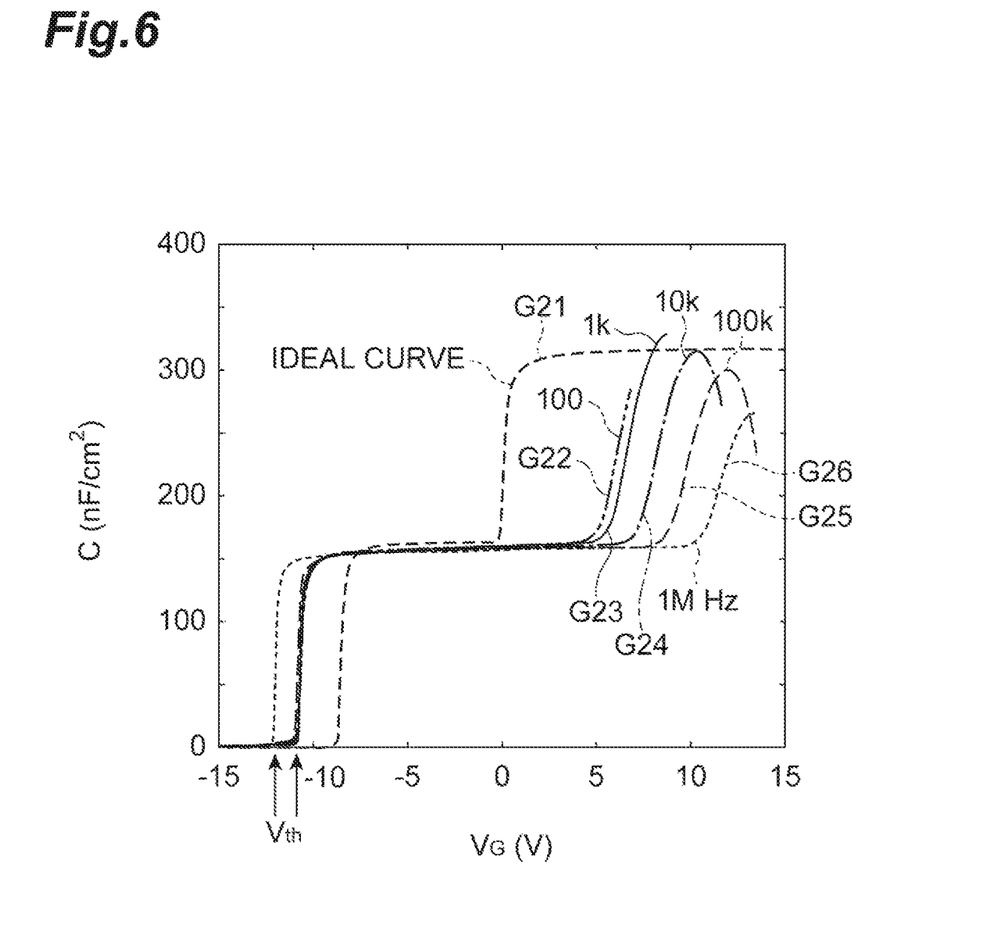
FIG. 6 is a graph showing results of measurement of CV characteristics of the transistor manufactured by the manufacturing method of the embodiment.

FIG. 6 is a graph showing the results of measurement of the capacitance-voltage (CV) characteristics of the transistor 1 manufactured by the manufacturing method of this embodiment. In this figure, the vertical axis represents the capacitance C (unit: nF/cm$^2$), and the horizontal axis represents the gate voltage $V_G$ (unit: V). In this measurement, CV characteristics are evaluated by providing an annular electrode (cathode) around the circular gate electrode (anode). The structure of the semiconductor stack 7 and the SiN films 11 and 12 is the same as that of the present embodiment. In the figure, a graph G21 shows an ideal curve assuming that the charge and interface state density in the SiN films 11 and 12 are zero. Graphs G22 to G26 show the case where the frequency of the applied voltage is 100 Hz, 1 k Hz, 10 k Hz, 100 k Hz, and 1 M Hz, respectively.

As shown in FIG. 6, in the negative and large gate voltage, the Fermi level $E_F$ on the gate electrode rises sufficiently to discharge all 2DEG in the channel, so that the capacitance C becomes almost zero. When the gate voltage becomes near −12 V, 2DEG is sequentially accumulated in the channel, and this charge contributes to the capacitance C. In the range of the gate voltage is +5 V from −10 V, since the capacitance due to the MIM (metal/insulator/metal) structure using the SiN films 11 and 12 as an insulator is dominant, the capacitance C is almost constant without change. When the gate voltage exceeds the positive 5 V, the interface state between the SiN films 11 and 12 having a long lifetime (e.g., several microseconds or more) appears above the Fermi level $E_F$, and this electric charge contributes to the capacitance C, so that the capacitance C has frequency dependency.

Referring to FIG. 6, it can be seen that the threshold voltage $V_{th}$ is shifted negatively in the transistor 1 according to the present embodiment, as compared with the ideal curve G21. The shifts in the measured results correspond to fixed positive charges density of $1.7\times10^{13}$ cm$^{-2}$. Therefore, the effect of suppressing the current collapse can be expected.

Figure 7:
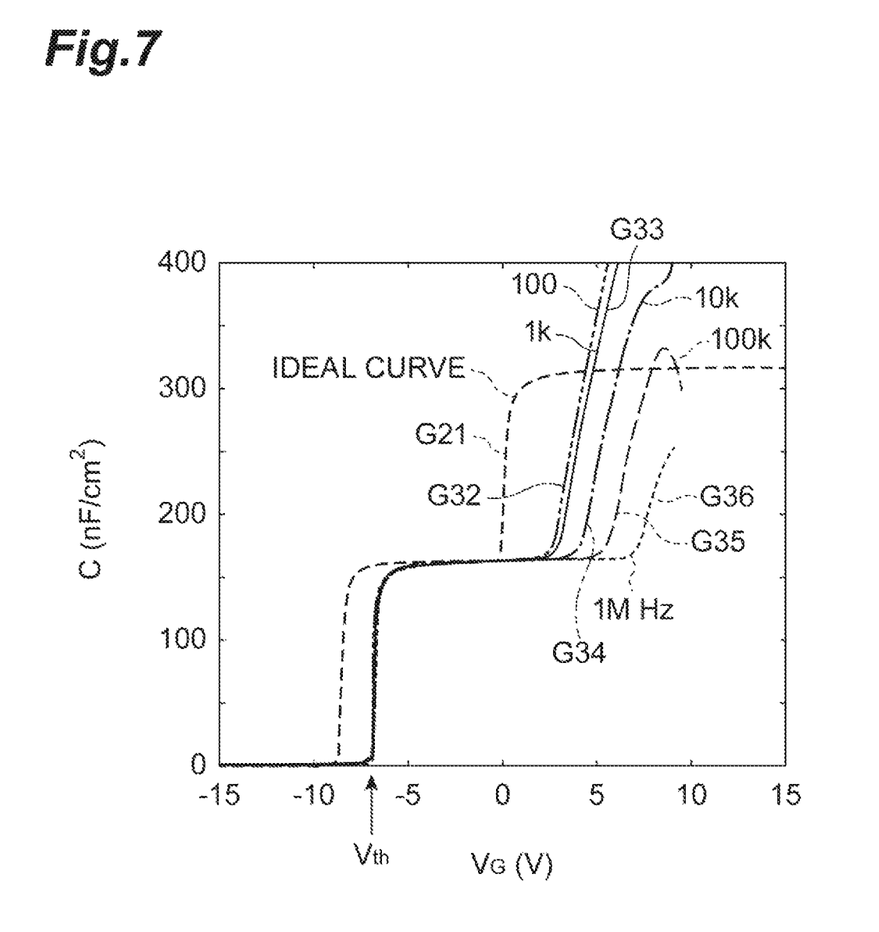
FIG. 7 is a graph showing the results of measuring the CV characteristics of the transistor without the interface oxide layer.

As a comparative example, FIG. 7 is a graph showing the results of measuring the CV characteristics of the transistor without the interface oxide layer 13 (i.e., not suspending the film formation of the SiN film). In the figure, the definition of the vertical and horizontal axes are the same as in FIG. 6. Further, the graph G21 is an ideal curve, the graphs G32 to G36 show the case where the frequency of the applied voltage is 100 Hz, 1 k Hz, 10 k Hz, 100 k Hz, and 1 M Hz, respectively. Referring to FIG. 7, it can be seen that the threshold voltage $V_{th}$ is shifted in the positive direction as compared with the ideal curve G21. Therefore, the effect of suppressing the current collapse cannot be expected.

Figure 8A:
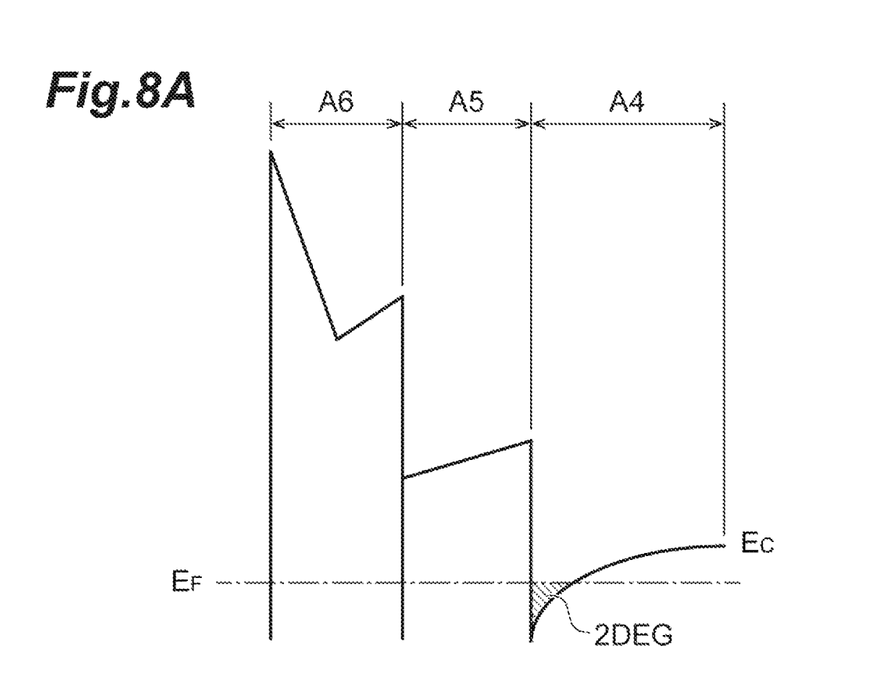
FIG. 8A is a band diagram of the transistor of the embodiment.
Figure 9A:
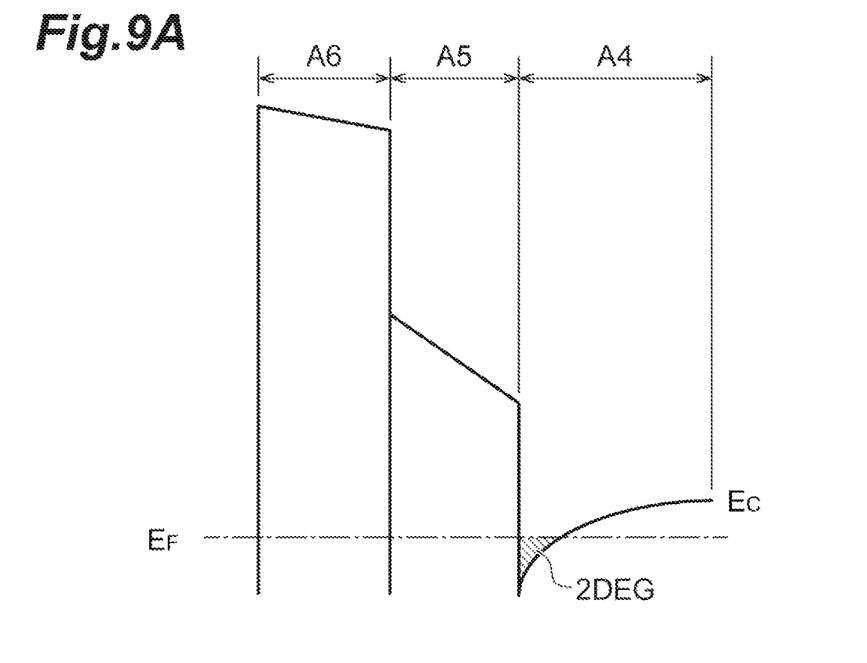
FIG. 9A is a band diagram of a transistor without the interface oxide layer as a comparative example.

FIG. 8A is a band diagram of the transistor 1 of the present embodiment. FIG. 9A is a band diagram of a transistor not including the interface oxide layer 13 (i.e., not suspending the film formation of the SiN film) as a comparative example. In the figure, the range A4 corresponds to the channel layer 4, the range A5 corresponds to the barrier layer 5, and the range A6 corresponds to the surface protection film 10, respectively. Incidentally, assuming the GaN layer as the channel layer 4 and a AlGaN layer as the barrier layer 5, respectively, 2DEGs are indicated by hatching. Referring to these figures, when the interface oxide layer 13 is provided (FIG. 8A), the potential at the interface between the SiN film 11 and AlGaN barrier layer 5 is lower than when the interface oxide layer 13 is not provided (FIG. 9A).

Figure 8B:
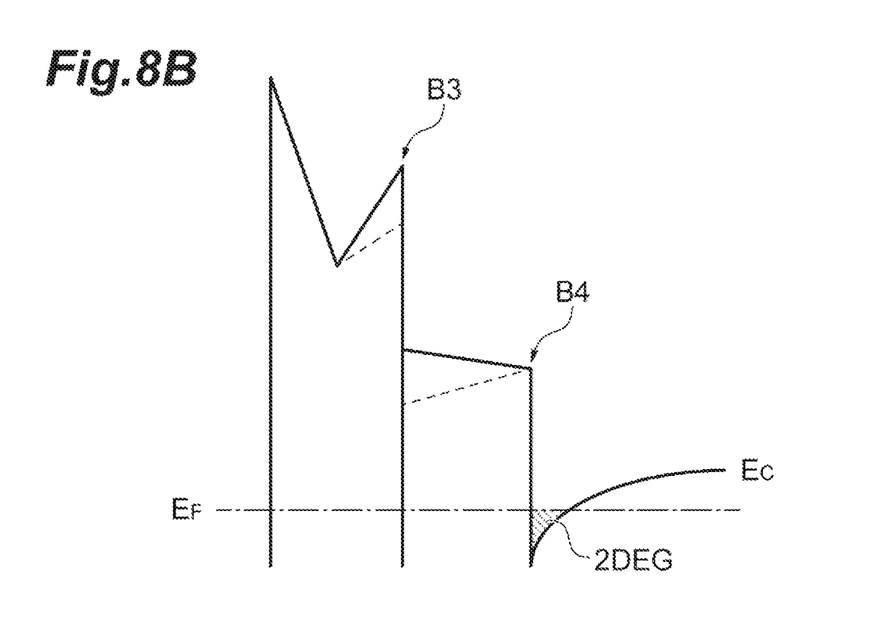
FIG. 8B is a band diagram when electrons are trapped in the interface state between the SiN film and AlGaN barrier layer in one embodiment.
Figure 9B:
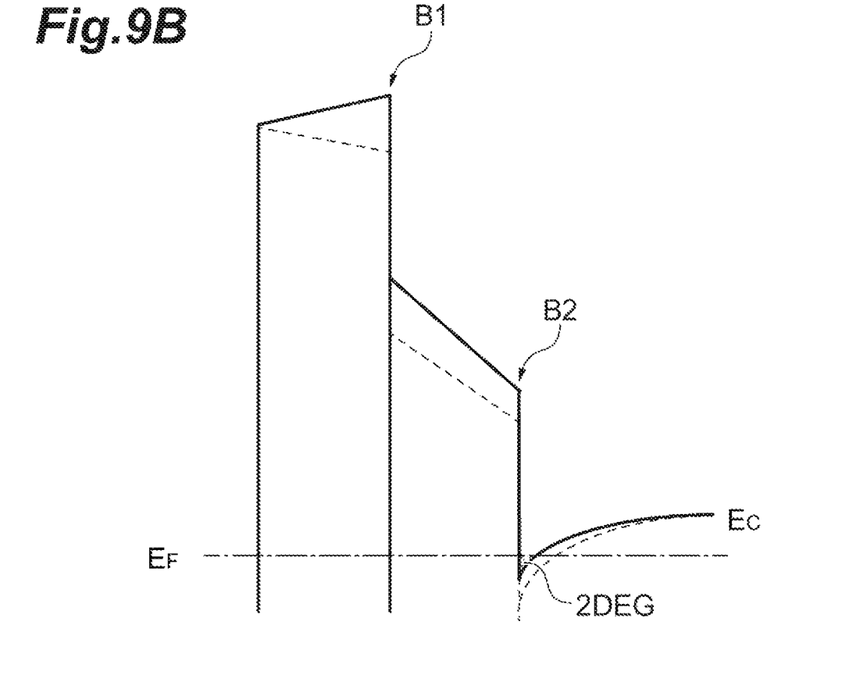
FIG. 9B is a band diagram when electrons are trapped in the interface state between the SiN film and AlGaN barrier layer in the comparative example.

FIG. 8B and FIG. 9B are band diagrams when electrons are trapped in the interface states between the SiN film 11 and AlGaN barrier layer 5 in the present embodiment and the comparative example, respectively. In these figures, band diagrams before capturing electrons (FIG. 8A and FIG. 9A) are indicated by broken lines. In the comparative example shown in FIG. 9B, the effect of the captured electrons by the interface state makes the potential of the interface between the SiN film 11 and AlGaN barrier layer 5 increased (B1 in the figure), and also makes the potential of the interface between AlGaN barrier layer 5 and the GaN channel layer 4 increased (B2 in the figure). This reduces the number of electrons in 2DEG. On the other hand, in the present embodiment shown in FIG. 8B, even if the potential of the interface between the SiN film 11 and AlGaN barrier layer 5 rises due to the influence of the trapped electrons by the interface state (B3 in FIG. 8B), the potential decrease due to the fixed positive charges alleviates the influence. Therefore, the effect on the potential of the interface between AlGaN barrier layer 5 and the GaN channel layer 4 is reduced (B4 in the figure), the reduction of electrons of 2DEG is suppressed.

As in the present embodiment, the interface oxide layer 13 may contain oxygen atoms exceeding $5\times10^{21}$ atoms/cm$^3$. When oxygen atoms having such concentrations are present in the interface oxide layer 13, fixed positive charges density larger than $8.5\times10^{12}$ cm$^{-2}$ can be expected. Since the fixed positive charges density is equal to or higher than the interface state densities of SiN/GaN (about $1.0\times10^{12}$ cm$^{-2}$ to $1.0\times10^{13}$ cm$^{-2}$) described in Literature 2, collapse suppressing effects can be sufficiently expected.

As in the present embodiment, the process of forming the interface oxide layer 13 evacuates the pressure in the furnace D to 1 Pa or less, sets the temperature in the furnace D the second temperature of 700° C. or higher and 900° C. or less and may keep the condition for at least 30 seconds. In this case, the interface oxide layer 13 can be easily formed.

As in the present embodiment, prior to the step of forming the SiN film 11, the furnace temperature is set to a temperature lower than the furnace temperature (the first temperature) when the SiN film 11 is deposited in the furnace D. And, after the pressure in the furnace D is evacuated to 1 Pa or less, the step (the leak check step) of making the the furnace D airtight and confirming the pressure rise corresponding to the flow rate of more than 0.1 sccm in the furnace D may be performed. Thus, it is confirmed that moisture and oxygen as a degas can be sufficiently supplied onto the surface of the SiN film 11 in the process of forming the interface oxide layer 13, and thus the yield can be increased.

In the process of forming the SiN films 11 and 12 as this embodiment, a ratio of a flow rate of dichlorosilane gas as a silicon raw material to a flow rate of ammonia gas as a nitrogen raw material may be set to 1:1. In this case, a high-quality SiN film can be formed.

As in the present embodiment, the furnace temperature (the second temperature) at the time of forming the interface oxide layer 13 and the furnace temperature (the third temperature) at the time of forming the SiN film 12 may be made equal to the furnace temperature (the first temperature) at the time of forming the SiN film 11. In this case, the time required for the temperature change can be omitted, and the SiN film 12 can be efficiently formed.

As in this embodiment, the film forming time of the SiN film 11 and the film forming time of the SiN film 12 may be made equal to each other. In this case, the thickness of the SiN film 11 and the thickness of the SiN film 12 are made equal to each other, so that the interface oxide layer 13 can be formed at an intermediate portion in the thickness direction of the surface protection film 10

As in the present embodiment, the SiN films 11 and 12 may contain chlorine atoms exceeding $1\times10^{20}$ atoms/cm$^3$. When the SiN films 11 and 12 are formed by the LPCVD method, the SiN films 11 and 12 contain such a high concentration of chlorine atoms. By forming the SiN films 11 and 12 by the LPCVD method, it is relatively easy to control the element composition ratio.

The manufacturing method of a HEMT and a HEMT according to the present disclosure are not limited to the above-described embodiments, and various other modifications can be made. For example, in the above embodiment, the film forming time of the SiN film 11 and the film forming time of the SiN film 12 are made equal to each other so that the SiN films 11 and 12 have the same thickness as each other, but the thickness of the SiN films 11 and 12 may be different from each other. In particular, if the SiN film 12 is thicker than the SiN film 11, the distance between the interface oxide layer 13 and the semiconductor multilayer 7 is shortened and the surface of the surface protection film 10 is moved away from the semiconductor stack 7, so that the effect of the fixed positive charge can be obtained more stably.

What is claimed is:

1. A method of manufacturing a high electron mobility transistor in a furnace, the method comprising steps of:
    forming a first SiN film on a surface of a semiconductor stack consisting of a nitride semiconductor and including a barrier layer by a low pressure chemical vapor deposition method at a first furnace temperature of 700° C. or more and 900° C. or less;
    forming an interface oxide layer on the first SiN film by moisture and oxygen in the furnace at a second furnace temperature of 700° C. or more and 900° C. or less and a furnace pressure of 1 Pa or lower; and
    forming a second SiN film on the interface oxide layer by the low pressure chemical vapor deposition method at a third furnace temperature of 700° C. or more and 900° C. or less.

2. The method of manufacturing the high electron mobility transistor according to claim 1,
    wherein the step of forming the interface oxide layer is continued for at least 30 seconds.

3. The method of manufacturing the high electron mobility transistor according to claim 1,
    wherein the steps of forming the interface oxide layer and forming the second SiN film set a ratio of a flow rate of dichlorosilane gas as a silicon raw material to a flow rate of ammonia gas as a nitrogen raw material to 1:1.

4. The method of manufacturing the high electron mobility transistor according to claim 1,
    wherein the second furnace temperature and the third furnace temperature are equal to the first furnace temperature.

* * * * *